United States Patent [19]
Young et al.

[11] Patent Number: 5,235,549
[45] Date of Patent: Aug. 10, 1993

[54] SEMICONDUCTOR DEVICE WITH APPARATUS FOR PERFORMING ELECTRICAL TESTS ON SINGLE MEMORY CELLS

[75] Inventors: Ian A. Young, Portland; Ananda G. Sarangi, Beaverton, both of Oreg.

[73] Assignee: Intel Corporation, Santa Clara, Calif.

[21] Appl. No.: 814,401

[22] Filed: Dec. 23, 1991

[51] Int. Cl.[5] .............................................. G11C 29/00
[52] U.S. Cl. ................................. 365/201; 365/230.06
[58] Field of Search ..................... 365/201, 230.06, 200

[56] References Cited

U.S. PATENT DOCUMENTS

| | | | |
|---|---|---|---|
| 4,899,313 | 2/1990 | Kumanoya | 365/201 |
| 4,914,632 | 4/1990 | Fujishima | 365/201 |
| 4,958,324 | 9/1990 | Devin | 365/201 |
| 4,992,985 | 2/1991 | Miyazawa | 365/201 |
| 5,060,198 | 10/1991 | Kowalski | 365/230.06 |
| 5,111,433 | 5/1992 | Miyamoto | 365/201 |
| 5,134,586 | 7/1992 | Steele | 365/201 |
| 5,151,881 | 9/1992 | Kajigaya | 365/201 |

Primary Examiner—Eugene R. LaRoche
Assistant Examiner—A. Zarabian

[57] ABSTRACT

A memory device having test circuitry incorporated into its design to enable direct external access to the bit lines of a single cell is described. When the device is put in test mode by applying external control signals, peripheral I/O circuitry is disabled. Once the I/O circuitry is disabled the test circuitry selects and enables the section of the array in which the selected cell is located through transfer circuits. The enabled transfer circuit for the selected section couples data between the selected cell and a set of predetermined I/O terminals.

4 Claims, 3 Drawing Sheets

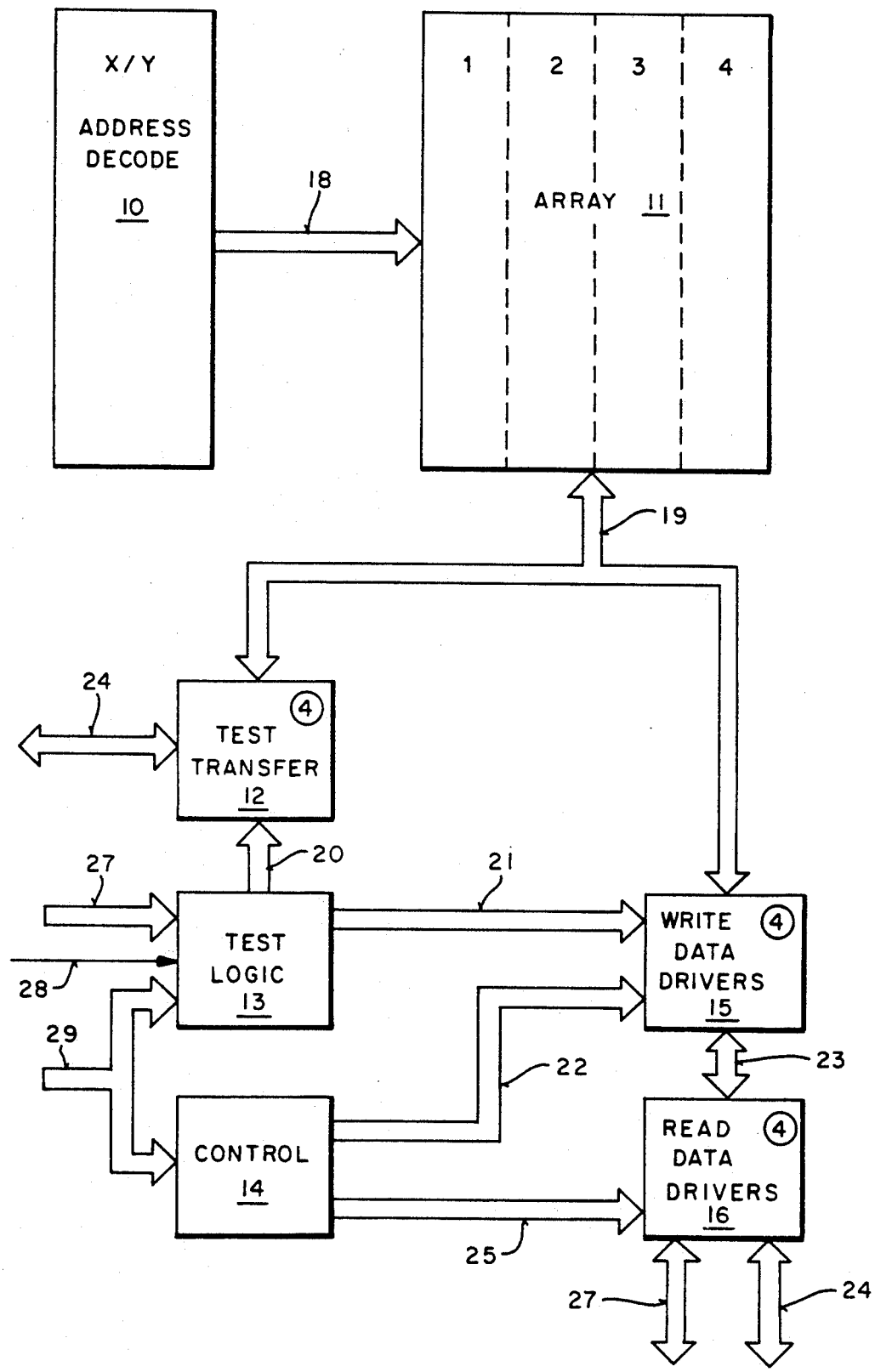
FIG_1

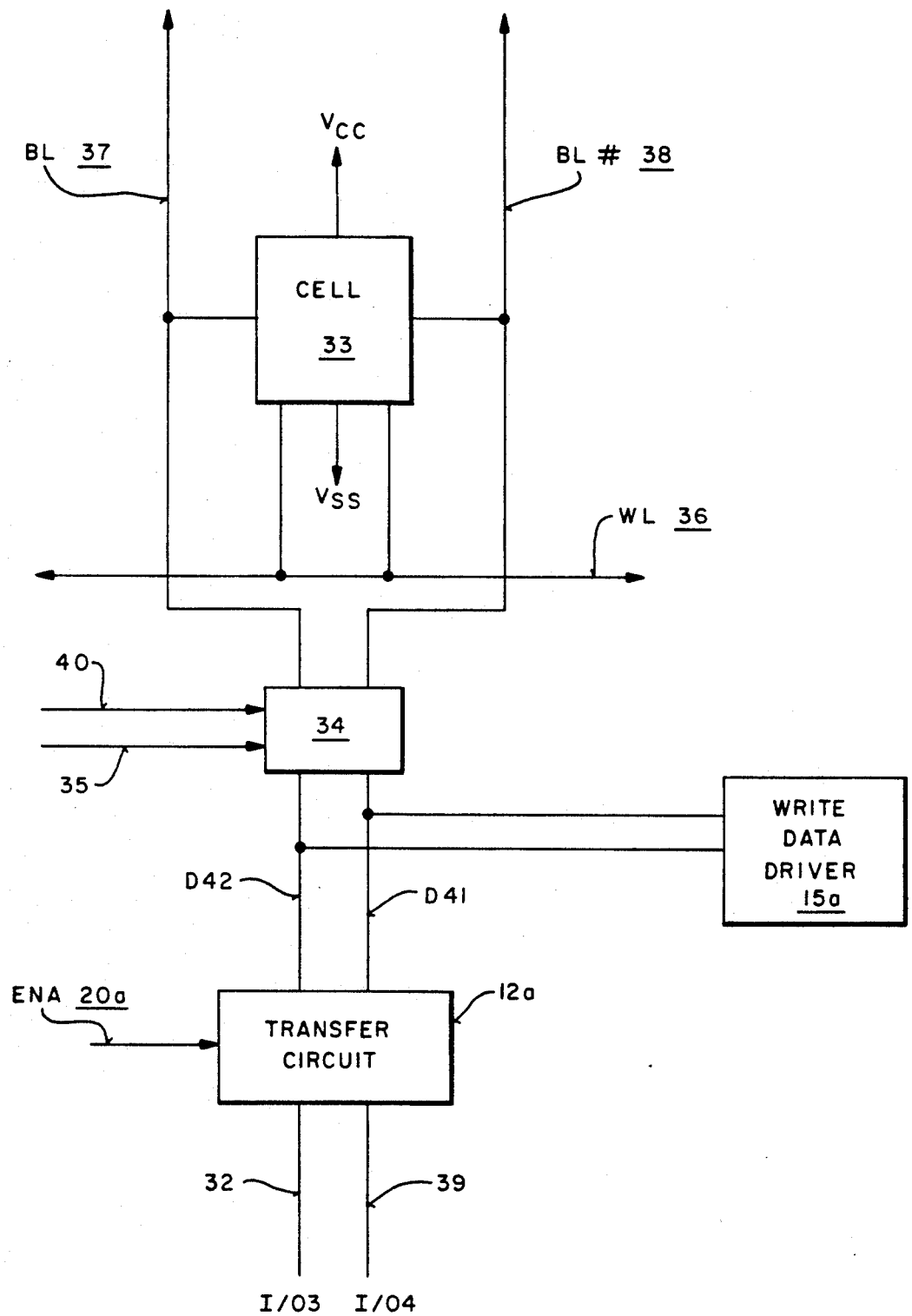
FIG_2

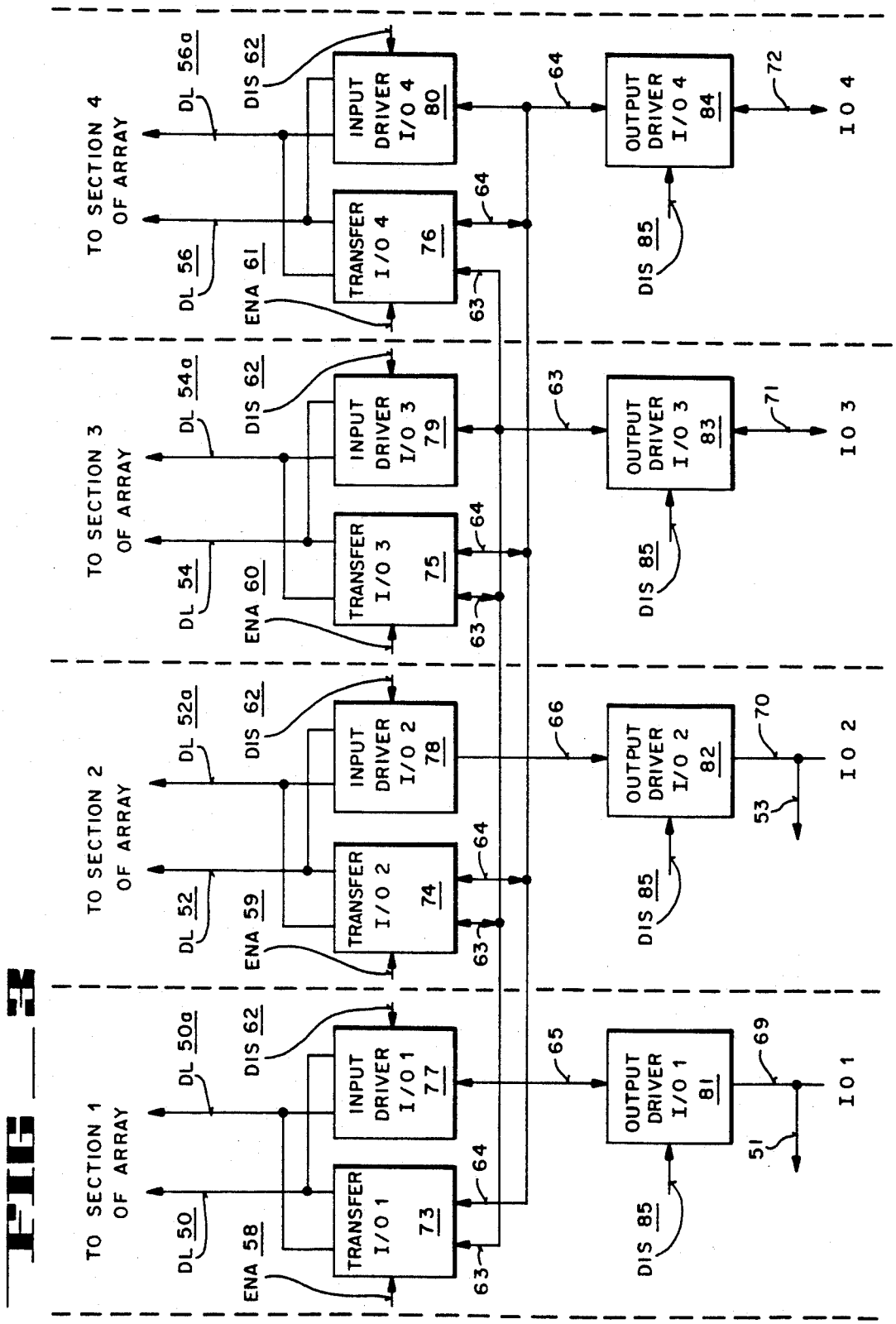

SEMICONDUCTOR DEVICE WITH APPARATUS FOR PERFORMING ELECTRICAL TESTS ON SINGLE MEMORY CELLS

FIELD OF THE INVENTION

The present invention relates to the field of semiconductor testing; in particular, to a memory device having test circuitry incorporated into its design for performing electrical tests on single memory cells.

BACKGROUND OF THE INVENTION

Ideally, in a properly fabricated semiconductor wafer, all of the integrated circuits would be functional. In reality, the number of functional devices may range from close to 100% to only a few good circuits per wafer.

Thus, when a device fails to function as it should, it is desirable to determine the cause of failure. By understanding failure mechanisms of nonfunctional devices, corrections may be made to eliminate or decrease the causes of these failures. Decreasing failures in subsequently fabricated devices results in increased wafer yield.

Specifically, if a failure occurs in a memory cell in the memory array of a memory device, it is preferable if electrical tests on that individual cell can be performed to determine its failure mode. Traditionally, memory devices have been designed such that individual memory cells are not directly accessible from the external input/output terminals of the chip. Very often, peripheral input/output circuitry, such as input (write) and output (read) data drivers, are located in the path between the cell and external terminals. This makes characterization of individual memory cells virtually impossible.

As will be seen, the present invention overcomes this problem by incorporating test circuitry directly into the memory device itself. This test circuitry functions to disable the peripheral I/O circuitry and to select and enable the section of the array in which the single cell is located so that electrical characterization can be performed. Consequently, the present invention enables testing of individual cells directly through the input/output terminals of the chip. Therefore, by providing a means for testing single cells, further knowledge of the cell's failure mechanisms is provided and device yield may be optimized.

SUMMARY OF THE INVENTION

A memory device designed to include an apparatus for performing electrical characterization tests on individual memory cells in the memory array is described.

To determine the electrical characteristics of a single memory cell it is advantageous to create a data path to the cell's bit lines from external input/output (I/O) terminals of the memory chip. By isolating input data drivers and output data drivers from this data path, bit lines are directly accessible to I/O terminals. Direct access to the selected cell's bit lines in achieved by utilizing test circuitry to select and enable the section of the array in which the cell is located, while disabling input/output data drivers for the whole array. The test circuity is comprised of a test logic circuit and a plurality of transfer circuits.

The input data drivers of the memory device are disabled by applying a predetermined signal on control terminals of the device. In the preferred embodiment, the write enable (WE), the chip select (CS) and the test (TST) pins of the device are all set low. When these three signals are coupled to the test logic circuit, the memory device is in test mode. In test mode, the test logic circuit sends a disable signal to all of the input data drivers, thus isolating them from the desired data path. Additionally, when the write enable (WE) signal is set low, the control circuit of the memory device disables all of the output data drivers. Once the memory device is in test mode and the input/output data drivers are disabled, the section in which the selected single cell is located may be selected and enabled.

To select the section in which the cell is located, logic signals are applied on a first set of predetermined I/O terminals (IO1 and IO2 in the preferred embodiment). These signals are coupled to the test logic circuit, causing it to generate an enable signal to one of the transfer circuits. This enable signal determines which transfer circuit is enabled and consequently, which section in the array is selected and enabled. The enabled transfer circuit for the selected couples data between the selected cell and a second set of predetermined I/O terminals (IO3 and IO4 in the preferred embodiment).

In the preferred embodiment before any electrical characterization is done, a given cell is accessed and data is written into it, while in test mode. Since the write enable signal (WE#) is low when the device is in test mode, the cell is in condition to be written into. Once data is written into the cell, it is ready to be electrically characterized. Electrical characterization of the single cell is performed by forcing voltages on terminals I/O3 and I/O4 and monitoring output currents on the same set of I/O terminals.

BRIEF DESCRIPTION OF THE DRAWINGS

The novel features believed characteristic of the invention are set forth in the appended claims. The invention itself however, as well as other features and advantages thereof, will be best understood by reference to the description which follows read in conjunction with the accompanying drawings, wherein:

FIG. 1 is a block diagram of a memory device utilizing the test circuity of the preferred embodiment of the present invention.

FIG. 2 shows a memory cell coupled to a transfer circuit utilized in the preferred embodiment of the present invention.

FIG. 3 is a block diagram showing the input and output data drivers of a memory device having four input/output terminals with the transfer circuitry utilized in the preferred embodiment of the present invention.

DETAILED DESCRIPTION OF THE PREFERRED EMBODIMENT(S)

A memory device having an apparatus for performing electrical characterization tests on an individual memory cell in the memory device is described. In the following description, numerous specific details are set forth in order to provide a thorough understanding of the invention. It will be obvious, however, to one skilled in the art that specific details need not be used to practice the present invention. In other instances, well-known structures have not been described in particular detail in order to avoid unnecessarily obscuring the present invention.

The memory device of the present invention is designed to incorporate a test apparatus for establishing direct access from an individual memory cell to the input/output terminals of the memory device. By isolating a data path from the cell to the I/O terminals, the cell may be electrically characterized. The apparatus, or test circuitry is comprised of a test logic circuit and a plurality of transfer circuits.

FIG. 1 shows a block diagram of the structure of a memory device with the test circuitry of the present invention. The structure of the array of the memory device shown in FIG. 1 is the same as a typical prior art memory device. Since the preferred embodiment of the present invention in FIG. 1 has four I/O terminals, the columns of the memory array 11 are divided into four sections 1,2,3 and 4. Each section has Y(n) columns. Thus, when the array 11 is addressed by the XY address decode 10 through bus 18, a single cell is accessed in each of the sections. The data stored in the accessed cell in each of these sections becomes one bit in the four bit I/O word of the device.

Data is transferred in the standard way, between the accessed cells through the data lines 19 for each section of the array. Since, each section couples data from the cells through either a data line or the data line complement, bus 19 represents four pairs of data lines (two for each section). Each pair of data lines are coupled to one input data driver. Thus for the memory device represented in FIG. 1, there are four input data drivers, (represented by the circled 4 in block 15 of FIG. 1). In addition to the four input data drivers, there are four output data drivers 16. Alternatively, the output data driver block could include the sense amplifier function.

As is common with prior art memory devices, the input data drivers are enabled and output data drivers are disabled, or tristated, during the write operation for the device shown in FIG. 1. In the preferred embodiment, this is achieved by setting the write enable (WE#) and chip select (CS#) signals, (represented by bus 29 in FIG. 1), low. These signals are coupled to the control circuit 14. The control circuit 14 responds by enabling all of the input data drivers through bus 22. Control circuit 14 also disables the four output data drivers 16 through bus 25 when WE# and CS# are set low. Consequently, by disabling the output data drivers during the write operation, a data path is established from the I/O terminals, I/O1-I/O4 (bus 24 and 27), to the array 11, through the input data drivers 15 and data lines 19 and bus 23. Thus, data can be written into the accessed memory cells.

The read operation is performed, in a similar manner. The write enable signal (WE#) is high during the read operation and consequently the input data drivers 15 have no effect on the data passing through it. Thus, during a read operation, a data path is established from the array 11 to the I/O terminals, I/O1-I/O4 (bus 24 and 27), through the output data drivers 16 and data lines 19 and bus 23.

Therefore, during a read or write operation, all four input or output data drivers are enabled, thus enabling all four sections of the memory array 11. To test a single cell in the array it is necessary to enable only one section and establish a data path from a set of I/O terminals to the bit line and the bit line complement for the selected single cell located within the enabled section. Test logic circuit 13 and the four test transfer circuits 12 (FIG. 1) are utilized during the test mode to perform these functions.

The test logic circuit 13 is responsive to the write enable (WE#) and chip select (CS#) signals through bus 29 and the test (TST#) signal on signal line 28. The test logic circuit 13 is coupled to all of the input data drivers 15 through bus 21. Bus 21 represents the four disable signal lines coupled to the four input data drivers 15. During test mode, when WE#, CS# and TST# are all set low, the test logic circuit 13 disables all of the input data drivers 15 through bus 21.

External I/O terminals I/O1 and I/O2 (bus 27) are also coupled to the test logic circuit 13. When the logic circuit 13 is in test mode, it responds to the logic input signals on I/O1 and I/O2 (bus 27) by enabling one of the four transfer circuits 12. The enable signals are coupled to the transfer circuits on bus 20. Since each section of the array is coupled to only one transfer circuit, the logic input signals on I/O1 and I/O2 selects only the section in which the selected single cell is located. When a transfer circuit 12 is enabled, the bit lines for the selected single cell in the selected section may be coupled directly to I/O3 and I/O4 (bus 24). I/O terminals I/O3 and I/O4 are coupled to the single cell through the data lines, the column transfer device for the selected column (as described below), and the enabled transfer circuit for that section.

FIG. 2 shows a transfer circuit 12a of the present invention coupled to a selected single cell 33, through the column transfer gate 34. The transfer circuit 12a is enabled through enabled signal ENA 20a from the test logic circuit. Once the section in the array in which cell 33 is located is selected by enabling transfer circuit 12a, it is necessary to access cell 33. The address decode circuit 10 (FIG. 1) accesses the wordline 36 (FIG. 2) and column line 35 or 40 (FIG. 2) for cell 33. The signal on line 35 allows the data to pass between the cells bitline BL37 and its dataline D42 through the column transfer device 34. Similarly, the signal on line 40 allows the data to pass between the bitline complement BL38 and its corresponding dataline D41 through the column transfer device 34.

During normal operation, a data path from the data lines (D42 or D41) through the input data driver 15a to the I/O terminal for that section of the array would be established. In contrast, during test mode all of the input data drivers are disabled. Therefore, when the transfer circuit 12a for the selected section is enabled, a data path is established between the bit lines of cell 33 and I/O3 (32) and I/O4 (39) through the transfer circuit 12a.

FIG. 3 illustrates the bottom peripheral circuitry of a memory device with four transfer circuits as described in the present invention, coupled to each of the four sections of the array. FIG. 3 more clearly illustrates the data path established during testing for each I/O quadrant in a memory device having four I/O terminals. DL50 and 50a, DL52 and 52a, DL54 and 54a, and DL56 and 56a represent the data lines from the Y(n) columns in sections 1, 2, 3, and 4, of the array, respectively. The data lines are coupled to their respective transfer circuit and input data driver. For example, the data lines DL50 and DL50a from section 1 are coupled to transfer circuit 73 and input data driver 77; DL52 and DL52a is coupled to transfer circuit 74 and input data driver 78; DL54 and DL54a is coupled to transfer circuit 75 and input data driver 79; and DL56 and DL56a is coupled to transfer circuit 76 and input data driver 80.

During a read or write operation a data path is established between the selected cell in each section and its respective I/O terminal, through either an input or output data driver. In contrast, during test mode, all of the input and output data drivers are disabled by signals DIS85 and DIS62. The DIS85 signal is generated from the device control circuit (14 FIG. 1) when the WE# and CS# signals are low. The DIS62 signal is generated from the test logic circuit (13 FIG. 1) when the device is put in test mode.

I/O terminals, I/O1 and I/O2, (signal lines 69 and 70) couple control signals to the test logic circuit 13 on signal lines 51 and 53. The test logic circuit 13 responds by enabling one of the transfer circuits 73, 74, 75, or 76 through enable signal lines ENA58, ENA59, ENA60, or ENA61. Consequently, when one of the transfer circuits is enabled, a data path between the selected section of columns and I/O terminals, I/O3 and I/O4 (signal lines 63 and 64) is established. Since the input data drivers are disabled, a direct data path is established between I/O3 terminal (signal line 71) and I/O4 terminal (signal line 72) and the bit lines of the selected cell.

Before performing any tests, data can be written into the memory cell. This is made possible since the selected column, during test mode, is in write mode i.e. WE#. Therefore, when the data path is established between external I/O terminals (IO3 and IO4) and the bit lines of the selected cell, the data on IO3 and IO4 can be written into the selected cell. Thus, once a direct data path is established between the bitlines of the cell and external I/O terminals, the memory device is in the desired state to begin testing.

It is obvious to one skilled in the art that a memory device having more that four I/O terminals may be designed to include the test apparatus as described for the present invention. For example in the case of a memory device having eight I/O terminals, it would be necessary to have eight transfer circuits. Additionally, it would be necessary to utilized more I/O terminals to select and enable the desired section in the array.

Therefore, it is to be understood that the particular embodiment shown and described by way of illustration are in no way intended to be considered limiting. Reference to the details of the preferred embodiment is not intended to limit the scope of the claims which themselves recite only those features regarded as essential to the invention.

I claim:

1. A semiconductor memory device having an array of memory cells arranged in rows and columns, a plurality of input/output (I/O) terminals for reading data from and writing data to said memory array, and I/O circuitry utilized during the reading and writing of said data into said memory array, said columns being sectioned into groups, each of said groups being comprised of a same number of said columns, an improvement for electrically characterizing a selected cell within said array comprising:

a logic means for disabling said I/O circuitry in response to a set of external control signals, said logic means also for generating an enable signal in response to a set of external select signals;

a plurality of transfer means, each of said plurality of transfer means coupled to said same number of said columns, wherein only one of said plurality of transfer means is enabled by said enable signal, said one of said plurality of transfer means for coupling test voltages to said selected cell directly from a first set of I/O terminals when said I/O circuitry is disabled;

wherein when a voltage is forced on said first set of I/O terminals, a current may be measured from said first set of I/O terminals.

2. The apparatus as described in claim 1 wherein said set of external select signals are coupled to said logic means through a second set of I/O terminals.

3. In a semiconductor memory device having an array of memory cells arranged in rows and columns, a plurality of input/output (I/O) terminals for reading data from and writing data to said memory array, and I/O data drivers utilized during the reading and writing of said data into said memory array, said columns being sectioned into groups, each of said groups being comprised of a same number of columns, an improvement for electrically characterizing a selected cell within said array comprising:

a logic means for disabling said input and output data driver in response to a set of external test control signals, said logic means also for generating an enable signal in response to a set of external test select signals;

a plurality of transfer means, each of said plurality of transfer means coupled to said same number of said columns, wherein only one of said plurality of transfer means is enabled by said enable signal, said one of said plurality of transfer means for coupling test voltages to said selected cell directly to a first set of I/O terminals when said input and output data drivers are disabled;

wherein when a voltage is forced on said first set of I/O terminals, a current may be measured from said first set of I/O terminals.

4. The apparatus as described in claim 3 wherein said set of external test select signals are coupled to said logic means through a second set of I/O terminals.

* * * * *